(12) United States Patent
Larsson et al.

(10) Patent No.: US 6,542,539 B1
(45) Date of Patent: Apr. 1, 2003

(54) MULTIPORTED REGISTER FILE FOR COEFFICIENT USE IN FILTERS

(75) Inventors: Patrik Larsson, Matawan; Christopher John Nicol, Red Bank, both of NJ (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 08/996,868

(22) Filed: Dec. 23, 1997

(51) Int. Cl.[7] ................................................ H03H 7/40
(52) U.S. Cl. ...................... 375/232; 375/229; 375/230; 370/286; 708/300
(58) Field of Search ................................ 375/232, 230, 375/229; 370/286; 364/724.19, 748.5; 708/301, 300, 819

(56) References Cited

U.S. PATENT DOCUMENTS

| | | | |
|---|---|---|---|
| 3,723,911 A | | 3/1973 | Forney, Jr. .................... 333/18 |
| 4,995,031 A | * | 2/1991 | Aly et al. .................... 370/286 |
| 5,313,551 A | | 5/1994 | Labrousse et al. .......... 711/149 |
| 5,477,534 A | * | 12/1995 | Kusano ....................... 370/286 |
| 5,657,291 A | | 8/1997 | Podlesny et al. ............ 365/230 |
| 5,721,696 A | * | 2/1998 | Pan et al. .................... 364/210 |
| 5,777,914 A | * | 7/1998 | Larsson et al. ......... 364/724.19 |
| 5,930,231 A | * | 7/1999 | Miller et al. ................ 370/210 |

FOREIGN PATENT DOCUMENTS

| EP | 98 30 9987 | 6/1999 | |
|---|---|---|---|
| JP | 62 284512 A | 12/1987 | .......... H03H/17/06 |

OTHER PUBLICATIONS

Patent No. 5,235,538, filed on Sep. 9, 1991 and issued on Aug. 10, 1993 to Norio Sumi, et al.. Class: 364/760.

Weste, Neil H.E. and Eshraghian, Kamran, Principles of CMOS VLSI Design—A Systems Perspectives, 2nd ed., Addison–Wesley Publishing Company, p. 19–21. and 547–554.

* cited by examiner

Primary Examiner—Stephen Chin
Assistant Examiner—Shuwang Liu

(57) ABSTRACT

Multiported register files for use in storing coefficients in adaptive FIR filters. incorporate computational ability, e.g., the ability to perform computation on coefficient values or derivatives thereof, or to control the operations performed thereon. For example, a multiported register file may incorporate an overflow/underflow detection and/or saturation unit. Also, the multiported register file may incorporate a special encoder to speed up the multiplication process, e.g., the so-called "Booth" encoder. Likewise, the multiported register file may incorporate a converter for changing the representation of the coefficients, e.g., a two's complement to sign-magnitude converter. All computation performed in the multiported register file is performed outside of the critical path of the filtering or of the coefficient updating. Using such improved multiported register files, adaptive FIR filters can be constructed which operate faster, and with lower power consumption.

39 Claims, 2 Drawing Sheets

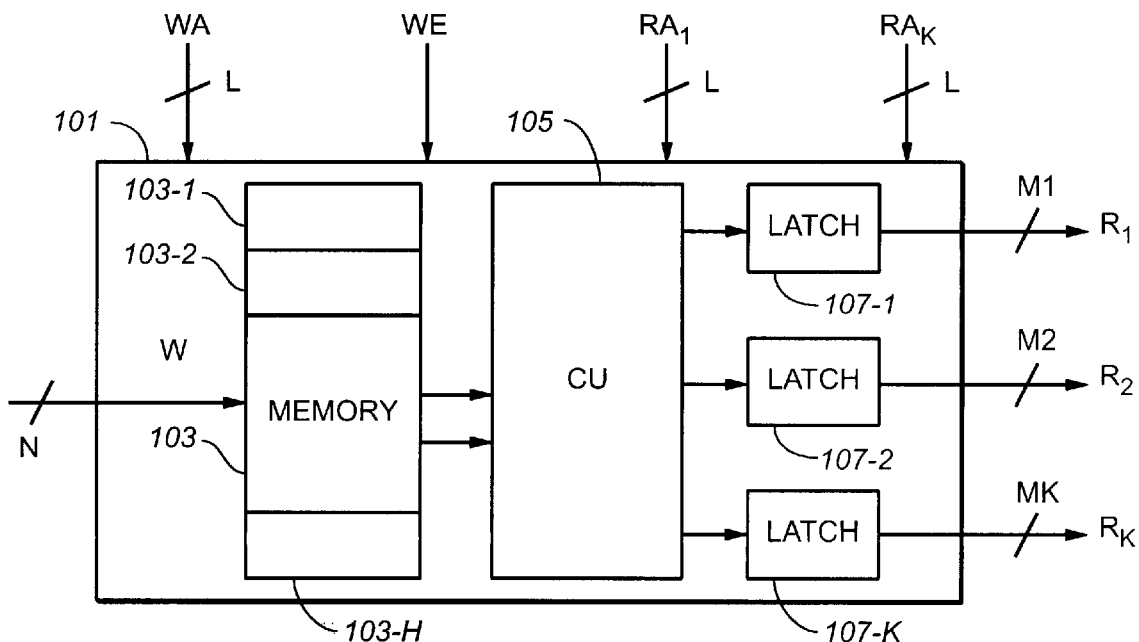
FIG._1
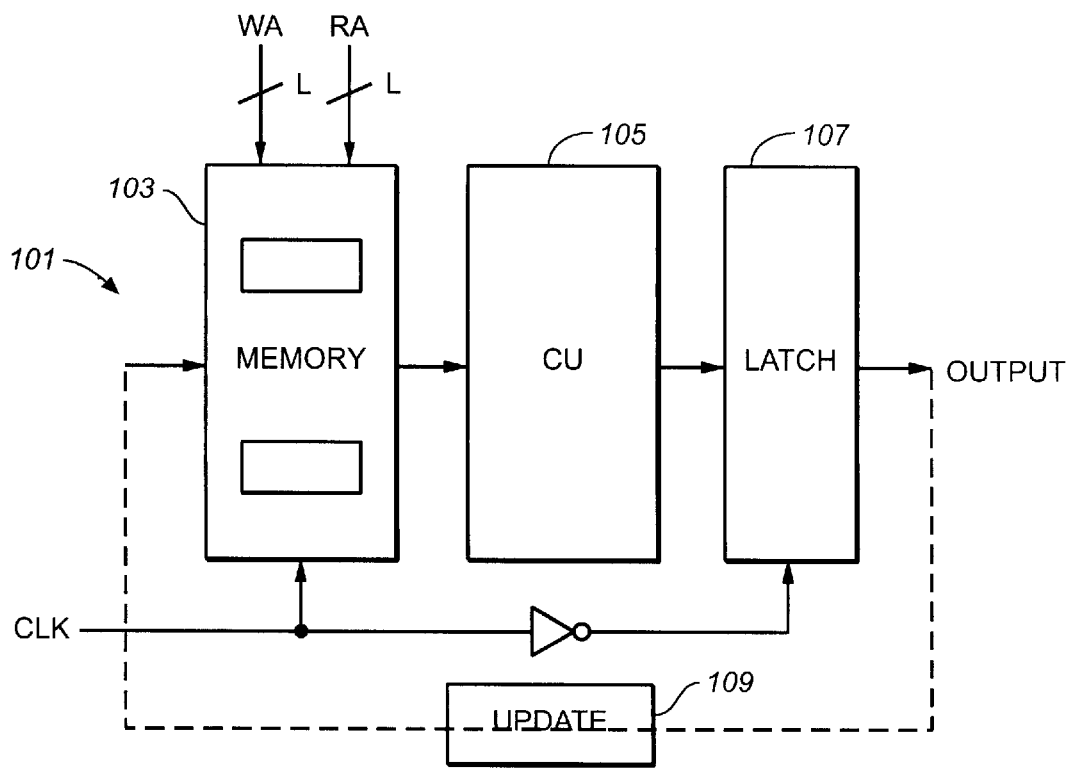
FIG._2

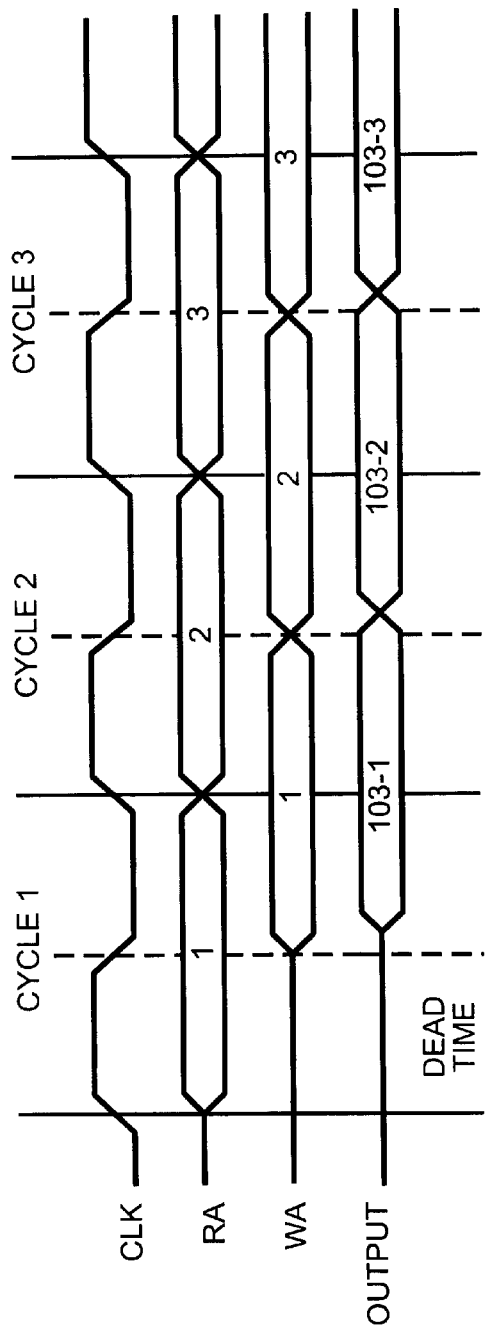
FIG._3
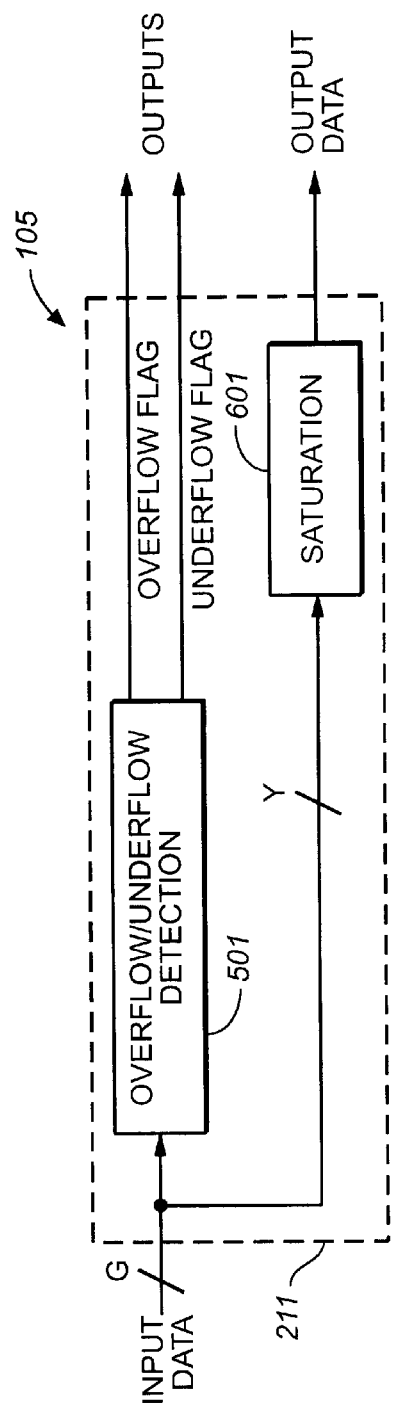
FIG._4

MULTIPORTED REGISTER FILE FOR COEFFICIENT USE IN FILTERS

TECHNICAL FIELD

This invention relates to finite impulse response (FIR) filters, and more particularly, to adaptive FIR filters using time multiplexed multipliers with multiple coefficients per multiplier.

BACKGROUND OF THE INVENTION

Prior art adaptive finite impulse response (FIR) filters employ fixed delay lines for recirculating the coefficients. Such delay lines are implemented using a series of edge triggered flip flops. As a result, in operation, the prior art delay lines consume more power than is desirable.

In copending U.S. patent application Ser. No. 08/937665, assigned to the same assignee as the instant application, multiported register files are employed to implement the coefficient storage and to provide the delays in the coefficients that are necessary for filter operation. A multiported register file is a memory, typically small, e.g., having a capacity for four words, with at least one read port and one write port. Data written into the multiported register file may be read out therefrom in any desired order. The multiported register file may have additional output ports from which the data stored therein may be read out, also in any desired order, and independent from the order of any other output port. In regards to coefficients, each multiported register file feeds data from one output port to the multiply-add portion of its associated stage of the FIR filter. In regards to an adaptive filter, each multiported register file feeds data from another output to the update unit for that coefficient. Note that these output ports may be the same, and if not, the data supplied to them may be the same. For coefficient use, there is no need to operate the multiported register file in the lookthrough mode described in the copending application.

When the FIR filter is an adaptive filter with updatable coefficients, it is necessary to have an update unit which computes new coefficient values. Such an update unit incorporates, or is associated with, an overflow/underflow detection and/or saturation unit, which is used in the prevention of catastrophic errors in the filter that could occur when overflow or underflow takes place. Such errors can occur because of the nature of conventional techniques for performing arithmetic using binary numbers. For example, when two large positive numbers represented using two's complement representation are added the result could appear to be a negative number, which clearly is erroneous. An overflow/underflow detection unit and/or saturation prevents this problem by supplying as an output, depending upon its incarnation, one of the following: a) flags indicating whether overflow or underflow has occurred; b) a value representing the maximum positive or negative number that can be represented as a saturation value; or c) the actual result of the calculation. This overflow/underflow detection and/or saturation unit lies in the critical path of coefficient updating circuitry, i.e., it is in the path that determines the maximum speed at which the updating can be performed. Thus, the speed at which the overflow/underflow detection and/or saturation process can be performed limits the speed of the updating process.

SUMMARY OF THE INVENTION

We have recognized that improved multiported register files may be used for storing coefficients in adaptive FIR filters. In accordance with the principles of the invention, the multiported register files of the prior copending application are improved by incorporating therein computational ability, e.g., the ability to perform computation on coefficient values or derivatives thereof, or to control the operations performed thereon. In accordance with one aspect of the multiported register file incorporates therein an overflow/underflow detection and/or saturation unit. In accordance with another aspect of the invention, the multiported register file incorporates therein a special encoder which is used to speed up the multiplication process, e.g., the so-called "Booth" encoder. In accordance with another aspect of the invention, the multiported register file incorporates therein a converter for changing the representation of the coefficients, e.g., a two's complement to sign-magnitude converter. In accordance with an aspect of the invention, all computation performed in the multiported register file is performed outside of the critical path of the filtering or of the coefficient updating. Advantageously, using such improved multiported register files, adaptive FIR filters can be constructed which operate faster, and with lower power consumption, than those of the prior copending application.

BRIEF DESCRIPTION OF THE DRAWING

In the drawing:

FIG. 1 shows an exemplary multiported register file which may be used to store coefficients in a finite impulse response filter (FIR), in accordance with the principles of the invention;

FIG. 2 shows a simplified view of the multiported register file of FIG. 1, along with a coefficient update unit and coefficient clocking;

FIG. 3 shows a timing diagram for the operation of the simplified view of the multiported register file shown in FIG. 1; and FIG. 4 shows an embodiment of overflow/underflow detection and/or saturation unit for use in the multiported register file of FIG. 1

DETAILED DESCRIPTION

FIG. 1 shows an exemplary multiported register file which may be used to store coefficients in a stage of a finite impulse response filter (FIR), in accordance with the principles of the invention. A multiported register file is a memory, typically small, e.g., having a capacity for four words, with at least one read port and one write port. Data written into the multiported register file may be read out therefrom in any desired order. The multiported register file may have additional output ports from which the data stored therein may be read out, also in any desired order, and independent from the order of any other output port.

More specifically, FIG. 1 shows multiported register file 101, including memory 103, which has memory locations 103-1 through 103-H, computation unit 105, and latches 107, including latches 107-1 through 107-K.

Although arbitrarily selectable at the discretion of the filter designer, H, the number of memory locations in the multiported register file is typically a small number, e.g., 4. Having a small value of H allows efficient FIR filter implementations—compared with other alternatives for implementing FIR filters—for processing signals having a sample rate that is within an order of magnitude of the fastest clock frequencies in the system, such as is found in modems for use in broadband access.

Data is written to multiported register file 101 via write port W, which includes N data lines. The particular one of memory locations 103 to which data presented at write port W is written to is specified by write address port WA.

Data is read from multiported register file 101 via any of read ports R, including read ports $R_1$ through $R_k$. Each of read ports $R_1$ through $R_k$ includes a respective number of data lines $M_1$ through $M_k$. If desired, a less precise representation of a value stored in multiported register file 101 may be read out therefrom. The particular one of memory locations 103 from which data is read for presentation to any one of read ports $R_1$ through $R_k$ is specified by an address supplied to the corresponding, e.g., like numbered, one of read address ports $RA_1$ through $RA_k$. No read enable signal is necessary to cause an output to appear at any of read ports $R_1$ through $R_k$. Simply supplying the appropriate read address is sufficient to generate the corresponding output. Typically, write address WA, and read address $RA_1$ through $RA_k$ have the same number of address lines, L.

When and whether data is written to multiported register file 101 is a function of the value of write enable signal WE. When WE has a first value data is written to multiported register file 101. When WE has the complementary value of the first value data is not written to multiported register file 101.

Data may be written to and read from multiported register file 101 at the same time. More specifically, data may be written to and read from the same particular one of memory locations 103 at the same time. Thus, a first value may be written to a particular one of memory locations 103 while at the same time a different value may be read from that very same particular location and supplied to one, or more, of read ports $R_1$ through $R_k$.

Latches 107 are conventional level sensitive latches such as are described by N. Weste and K. Eshraghian on pages 19–21 of *Principles of CMOS VLSI Design, 2nd Ed.*, Addison Wesley, 1992, which is incorporated by reference as if fully set forth herein. Thus, any one of memory locations 103 may act as a master latch while any one of latches 107 may act as a slave latch to form an edge triggered flip-flop, with computation unit 105 interposed therebetween.

FIG. 2 shows a simplified view of multiported register file 101, where only two memory locations 103 are shown with only a single read port and a single write port. Also shown is the clock signal (CLK) which is used to control operation and data transfer between memory 103 and latches 107 and coefficient update unit 109. In FIG. 2, memory 103 is positive level sensitive while latch 107 is negative level sensitive. Together they form a negative edge triggered flip-flop.

In accordance with the principles of the invention, computation unit 105 takes at least one coefficient value and performs some type of transformation on it, or passes the coefficient value unchanged. Computation unit 105 is interposed between memory locations 103 and latches 107, so that computation unit 105 may a) receive coefficient values from memory locations 103 and b) supply its output to one or more of latches 107.

In accordance with an aspect of the invention, all computation performed in the multiported register file is performed outside of the critical path of the filtering or of the coefficient updating. Computation unit 105 is outside of the critical path of the filtering or of the coefficient updating because it performs its function in the so-called "dead time" between the time that the master latch, which herein is the currently addressed location in memory 103, contains the stored information and the time that the slave latch, herein latch 107, latches the information from the master latch. This is made possible because the read address signal is supplied to read address ports $RA_1$ through $RA_k$ earlier than the clock signal is supplied to latches 107.

FIG. 3 shows a timing diagram for the operation of the simplified view of multiported register file 101 shown in FIG. 2. FIG. 3 shows signals CLK, RA, WA and OUTPUT from latch 107. Note that signals CLK, RA, and WA are supplied to multiported register file 101, which generates signal OUTPUT. Read address signal RA is supplied to multiported register file 101 one half cycle ahead of write address signal WA. In response to signal RA, which changes shortly after every positive edge of CLK, data comes out of memory 103 and is processed by computation unit 105 prior to the negative edge of CLK. Note that by shortly it is meant that there is enough time for computation unit 105 to perform its required calculation.

On the negative edge of CLK, latch 107 latches the processed data supplied as the output of computation unit 105. This data is then made available as OUTPUT, the output of multiported register file 101. This data is supplied to update unit 109, as well as to the multiplier of the filter (not shown) which is being implemented using multiported register file 101. Shortly after the next positive edge, RA changes and another coefficient is read out from one of memory locations 103. Meanwhile, the output data that was latched on the previous negative edge is still available from latch 107. On the next negative edge of CLK, the updated data which is supplied as the output of update unit 109 is written back into memory 103 to a location specified by WA, which changes only a short time after the negative edge of CLK.

In one embodiment of the invention, computation unit 105 is an overflow/underflow detection and/or saturation unit. FIG. 4 shows an exemplary embodiment in which computation unit 105 is implemented as overflow/underflow detection and/or saturation unit 211. Overflow/underflow saturation unit 211 includes overflow/underflow detection unit 501 connected to saturation detection unit 601.

Overflow/underflow detection unit 501 may operate, for example, in a conventional, well known manner, such as by determining whether a received input a number with G bits of precision can be represented with Y bits of precision, where Y is less than G. If the received input is a number with G bits of precision and that input can be represented with Y bits of precision, no underflow or overflow is determined to occur. Therefore, the value of the input number is supplied as the output of overflow/underflow detection and/or saturation unit 211 but using only Y bits of precision. Otherwise, if the magnitude of the number is too large to be represented with only Y bits of precision, underflow, or overflow, is determined to have occurred. If overflow or underflow has occurred, the corresponding flag is set and supplied as an output. Which of overflow or underflow has occurred is determined by whether or not the input is greater than the maximum value that can be represented with Y bits of precision or less than the minimum value that can be represented with Y bits of precision.

Saturation detection unit 601 may operate, for example, in a conventional, well known manner. For example, saturation detection unit 601 receives as inputs a number with Y bits of precision, and the values of an overflow flag and an underflow flag. If the overflow flag is set, saturation detection unit 601 supplies as an output the maximum value that can be represented using Y bits of precision. If the underflow flag is set, saturation detection unit 601 supplies as an output the minimum value that can be represented using Y bits of precision. If neither the overflow flag nor the underflow flag is set, saturation detection unit 601 supplies as an output the input value, but only using Y bits of precision.

The resulting operation of overflow/underflow detection and/or saturation unit 211 is that it receives as an input a number with G bits of precision and supplies as an output a) the actual value of G using Y bits of precision, where Y is less than G, when G can be represented with Y bits of precision, or b) the maximum or minimum value that can be represented using Y bits of precision when the magnitude of the number is too large to be represented with only Y bits of precision. Whether the maximum or minimum value is supplied as an output is determined as a function of whether or not the input is greater than the maximum value that can be represented with Y bits of precision or less than the minimum value that can be represented with Y bits of precision.

In accordance with an aspect of the invention, the values of overflow flag and/or underflow flag, may be supplied as outputs from computation unit 105, and they may even be supplied externally as an output from multiported register file 101. If the values of overflow flag and/or underflow flag are supplied externally from multiported register file 101, then it is necessary that latches 107 be augmented to be able to transmit this information as well.

In another embodiment of the invention, computation unit 105 is a data converter. For example, computation unit 105 may be a special encoder which is used to speed up the multiplication process, e.g., the so-called "Booth" encoder. Booth encoders are described by N. Weste and K. Eshraghian on pages 547–554 of *Principles of CMOS VLSI Design, 2$^{nd}$ Ed.*, Addison Wesley, 1992, which is incorporated by reference as if fully set forth herein. Note that Booth encoders are referred to therein as Booth recoders.

In another exemplary embodiment of the invention, the multiported register file incorporates therein a converter. For example computation unit 105 may be an adder for converting carry-save format representation of said coefficient to a two's complement representation for changing the representation of the coefficients, e.g., a two's complement to sign-magnitude converter.

Note that there may be multiple functions performed by computation unit 105 and these functions may be performed on different ones of the coefficients, either at substantially the same time, or sequentially so long as the computation is completed during the dead time. The functions performed may also change from clock cycle to clock cycle.

The foregoing merely illustrates the principles of the inventions. It will thus be appreciated that those skilled in the art will be able to devise various arrangements which, although not explicitly described or shown herein, embody the principles of the invention and are included within its spirit and scope.

What is claimed is:

1. A device for storing coefficients for use in an adaptive FIR filter comprising:
   a multiported register file comprising:
      memory for storing coefficient values;
      an output latch; and
      computation means for performing operations on one or more of a set including said coefficient values and derivatives of said coefficient values, said computation means being outside of any critical path for updating said coefficient values.

2. The invention as defined in claim 1 wherein said computation means includes at least an overflow/underflow detection unit.

3. The invention as defined in claim 1 wherein said computation means includes at least a saturation unit.

4. The invention as defined in claim 1 wherein said computation means includes at least an overflow/underflow detection and/or saturation unit.

5. The invention as defined in claim 1 wherein said computation means includes at least an encoder.

6. The invention as defined in claim 1 wherein said computation means includes at least a Booth encoder.

7. The invention as defined in claim 1 wherein said computation means includes at least a converter for converting said coefficients from a first representation to a second representation.

8. The invention as defined in claim 1 wherein said computation means includes at least a two's complement to sign-magnitude converter.

9. The invention as defined in claim 1 wherein said computation means includes at least an adder for converting carry-save format representation of said coefficient to a two's complement representation.

10. The invention as defined in claim 1 wherein said computation means is coupled between said memory and said output latch.

11. The invention as defined in claim 1 wherein said memory and said latch form a register.

12. A device for storing coefficients for use in an adaptive FIR filter comprising:
    a multiported register file, comprising:
       memory for storing coefficient values used in said adaptive FIR filter;
       an output latch; and
       computation means for performing operations on values derived from said coefficient values, wherein said computation means being outside of any critical path for performing update operations on said coefficient values and said computation means being coupled between said memory and said output latch.

13. The invention as defined in claim 12 wherein said values derived from said coefficient values are identical to said coefficient values.

14. The invention as defined in claim 12 wherein said computation means includes at least an overflow/underflow detection and/or saturation unit.

15. The invention as defined in claim 12 wherein said computation means includes at least an encoder.

16. The invention as defined in claim 12 wherein said computation means includes at least a Booth encoder.

17. The invention as defined in claim 12 wherein said computation means includes at least a converter for converting said coefficients from a first representation to a second representation.

18. The invention as defined in claim 12 wherein said computation means includes at least a two's complement to sign-magnitude converter.

19. The invention as defined in claim 12 wherein said computation means includes at least an adder for converting carry-save format representation of said coefficient to a two's complement representation.

20. The invention as defined in claim 12 wherein said memory and said latch form a register.

21. A device for storing coefficients for use in an adaptive FIR filter comprising:
    a multiported register file, comprising:
       at least two memory locations, each memory location storing a coefficient value used in said adaptive FIR filter;
       at least one output latch; and computation means for performing operations on said coefficient values, or derivatives thereof, wherein at least one of said memory locations acts as a master latch and at least one output latch acts as a slave latch which together form an edge triggered flip-flop with said computation means being interposed between said master latch and said slave latch and said computation means being outside of any critical path for performing updates to said coefficient values and.

22. The invention as defined in claim 21 wherein said computation means includes at least an overflow/underflow detection and/or saturation unit.

23. The invention as defined in claim 21 wherein said computation means includes at least an encoder.

24. The invention as defined in claim 21 wherein said computation means includes at least a Booth encoder.

25. The invention as defined in claim 21 wherein said computation means includes at least a converter for converting said coefficients from a first representation to a second representation.

26. The invention as defined in claim 21 wherein said computation means includes at least a two's complement to sign-magnitude converter.

27. The invention as defined in claim 21 wherein said computation means includes at least an adder for converting carry-save format representation of said coefficient to a two's complement representation.

28. The invention as defined in claim 21 wherein said computation means is coupled between said memory and said output latch.

29. The invention as defined in claim 21 wherein said memory and said latch form a register.

30. A method for use in connection with a device for use in an adaptive FIR filter, the method comprising the steps of:
supplying a coefficient value as an output from a memory comprising a multiported register file;
performing a computation on said coefficient value to produce a transformed coefficient value for use in said adaptive FIR filter said computation performed by way of a computation means placed outside of any critical path for transforming coefficient values; and
latching said transformed coefficient value in a latch;
wherein said steps of supplying and latching are performed so as to form a register from said memory and said latch.

31. The invention as defined in claim 30 wherein said steps of supplying, performing, and latching are performed external to a critical path of said register file.

32. The invention as defined in claim 30 further including the step of storing said latched transformed coefficient value into the same location of said memory from which said coefficient value was supplied in said supplying step.

33. The invention as defined in claim 30 further including the step of storing said latched transformed coefficient value into the same location of said memory from which said coefficient value was supplied in said supplying step and wherein said steps of supplying, performing, latching, and storing are performed external to a critical path of said register file.

34. The invention as defined in claim 30 wherein said computation includes at least Booth encoding.

35. The invention as defined in claim 30 wherein said computation includes at least overflow/underflow detection.

36. The invention as defined in claim 30 wherein said computation includes at least saturation detection.

37. The invention as defined in claim 30 wherein said supplying step is substantially performed when a clock has a first value and said latching is performed when said clock has a second value.

38. The invention as defined in claim 30 wherein said computation is performed in the dead time of said register.

39. A device for storing coefficients for use in an adaptive FIR filter comprising:
a multiported register file comprising:
memory for storing coefficient values used in said adaptive FIR filter;
an output latch; and
computation means for performing operations on one or more of said coefficient values, said computation means being coupled between said memory and said output latch, said computation means being outside of any critical path for updating said coefficient values.

* * * * *